(12) United States Patent
Moreni et al.

(10) Patent No.: US 10,829,851 B2
(45) Date of Patent: Nov. 10, 2020

(54) BOX COATING APPARATUS FOR VACUUM COATING OF SUBSTRATES, IN PARTICULAR SPECTACLE LENSES, AND HEATING DEVICE FOR IT

(71) Applicant: Satisloh AG, Baar (CH)

(72) Inventors: Franco Moreni, Olgiate Olona (IT); Antonio Corea, Sedriano (IT); Tiziano Deodato, Bareggio (IT); Giuseppe Di Paola, Corbetta (IT)

(73) Assignee: Satisloh AG, Baar (CH)

( * ) Notice: Subject to any disclaimer, the term of this patent is extended or adjusted under 35 U.S.C. 154(b) by 281 days.

(21) Appl. No.: 15/901,246

(22) Filed: Feb. 21, 2018

(65) Prior Publication Data

US 2018/0245210 A1 Aug. 30, 2018

(30) Foreign Application Priority Data

Feb. 24, 2017 (EP) .................... 17000297

(51) Int. Cl.
*C23C 14/30* (2006.01)
*C23C 14/56* (2006.01)
(Continued)

(52) U.S. Cl.
CPC .............. *C23C 14/30* (2013.01); *C23C 14/24* (2013.01); *C23C 14/50* (2013.01); *C23C 14/564* (2013.01); *G02B 1/11* (2013.01)

(58) Field of Classification Search
CPC ....... C23C 14/30; C23C 14/24; C23C 14/564; C23C 14/50; C23C 14/28; C23C 16/4402;
(Continued)

(56) References Cited

U.S. PATENT DOCUMENTS 3,660,158 A  5/1972  Chen et al.
6,495,002 B1  12/2002  Klepper et al.
(Continued)

FOREIGN PATENT DOCUMENTS

JP         01136966      5/1989
WO    WO2013168747 A1   1/2016

OTHER PUBLICATIONS

European Search Report, Applicant: Satisloh AG, Application No. 17000297.6, dated Sep. 12, 2017, 9 pages.
(Continued)

Primary Examiner — Rudy Zervigon
(74) Attorney, Agent, or Firm — Reising Ethington P.C.

(57) ABSTRACT

A box coating apparatus for vacuum coating of substrates comprises a vacuum chamber which contains an evaporation source for evaporating coating material and a substrate holder disposed vis-à-vis to the evaporation source so that coating material evaporated by the evaporation source can impinge on substrates held by the substrate holder. An electric heating device is centrally arranged in the vacuum chamber, which is constructed to heat up the vacuum chamber during vacuum check and cleaning routines. So as to be removable from the vacuum chamber prior to the deposition processes, the heating device is provided with a stand having a plurality of leg portions mounted to a base plate, which are sized and constructed at the base plate so that the heating device can be placed over and above the evaporation source.

32 Claims, 14 Drawing Sheets

(51) Int. Cl.
*C23C 14/24* (2006.01)
*C23C 14/50* (2006.01)
*G02B 1/11* (2015.01)

(58) Field of Classification Search
CPC ............ C23C 16/45544; C23C 16/405; C23C 16/45578; C23C 16/448; G02B 1/11; H01L 21/67017; B01D 45/08; B01D 50/002
USPC .................. 118/723 VE, 726; 156/345.29
See application file for complete search history.

(56) References Cited

U.S. PATENT DOCUMENTS

| | | |
|---|---|---|
| 8,926,755 B2 | 1/2015 | Chang et al. |
| 2005/0061251 A1* | 3/2005 | Wei .................... C23C 14/26 118/726 |

OTHER PUBLICATIONS

Satisloh Brochure "An introduction to the coating of ophthalmic lenses", 2nd Edition, 2006, 36 pages.

* cited by examiner

BOX COATING APPARATUS FOR VACUUM COATING OF SUBSTRATES, IN PARTICULAR SPECTACLE LENSES, AND HEATING DEVICE FOR IT

TECHNICAL FIELD OF THE INVENTION

The present invention generally relates to a box coating apparatus for vacuum coating of substrates. Such an apparatus generally serves the purpose of high vacuum deposition of multilayer thin films on substrates of various materials, both organic and inorganic, usually used in optical applications. In particular, the present invention relates to a box coating apparatus for vacuum coating of spectacle lenses, which has useful application for large-scale production of spectacle lenses. In this case, typically, the box coating apparatus serves the purpose of applying a multilayer antireflection (AR) coating on the spectacle lenses in order to provide the latter with a low residual reflection and a desired color. It can however also be used for other coating purposes, e.g., for applying on top of such AR coating a top coating (TC) selected from a group comprising hydrophobic, oleophobic and dust repelling coatings. The present invention also relates to a heating device for such box coating apparatus, which mainly serves to heat up a vacuum chamber in case of vacuum check and cleaning routines.

BACKGROUND OF THE INVENTION

The coating technology at issue—that is known per se—is a physical vapor deposition (PVD) process, to be more precise a coating process by thermal evaporation. In thermal evaporation the bulk of the deposition material undergoes a transition from solid to vapor state by thermal heating or electron bombardment.

The evaporated material is then carried to the substrate where the growing of the thin film occurs. The critical parameters of such a coating technology are mainly the average speed of the evaporated particles and their angular distribution. The base pressure must be kept in the high vacuum range to minimize the number of impact events between the evaporant particles and the residual gases in the vacuum chamber where the process takes place. High vacuum allows the particles to have a sufficiently long "mean free path" for the thin film to grow at the substrate level. High vacuum also ensures that, as the evaporated material is transported from the evaporator to the surfaces being coated, it does not (or to a very limited extent only) undergo chemical reactions with residual gases in the vacuum chamber. For these reasons the vacuum chamber needs to be pumped down to, e.g., about $3 \times 10^{-3}$ Pa before coating is begun.

To serve this purpose, a known box coating apparatus, e.g. the box coating apparatus "1200 DLX box coater" available from the present applicant Satisloh AG, Switzerland, in particular has a pumping system including a high vacuum valve mechanism connected to the vacuum chamber, the basic structure and functions of which are described in the brochure "An Introduction To The Coating Of Ophthalmic Lenses", $2^{nd}$ Edition 2006, available from the present applicant to which explicit reference shall be made at this point.

Working with such a high vacuum system requires to constantly check the vacuum chamber for vacuum leaks that could affect the vacuum level and performances during deposition processes. Having a vacuum leak in a high vacuum system leads to a higher final vacuum value inside the vacuum chamber and could also have a large influence on the mass distribution of the residual gas: for a high vacuum system without vacuum leaks, the major part of the residual gas in the vacuum chamber is usually represented by water molecules, while in case of vacuum leaks, in addition to water, the residual gas also contains nitrogen and oxygen (following standard air chemical composition). Having a vacuum leak can therefore have a strong impact at PVD process level not only because of the mechanical scattering between evaporated atoms and residual gases, but also because of the chemical interaction between oxygen coming from vacuum leaks and the deposited layers.

As to possible causes for vacuum leaks, in a box coating apparatus a vacuum leak can be generated with time because of the mechanical failure/deterioration of the different vacuum chamber components (stainless steel chamber walls/weldings, mechanical, electrical and gas feedthroughs into the vacuum chamber, viewports, sealing measures, such as gaskets and O-rings, etc.), or during the pumping down of the vacuum chamber with the related venting/opening cycles during which, e.g., O-rings can get dirty or damaged leading to a vacuum leak along the sealing.

Different methods can be adopted to check the presence of vacuum leaks. One frequently used, preferred leak testing method is the pressure rise test which can be automated so that no operator is necessary and the box coating apparatus can do the test on its own overnight or during weekends. In the first part of the pressure rise test the aim is to reach the best possible vacuum level inside the vacuum chamber by operating the pumping system of the box coating apparatus and reducing as much as possible the outgassing rate from the walls of the vacuum chamber and from the various functional components inside the vacuum chamber. Previously, a top heating system is used during this preparation step to clean as much as possible the vacuum chamber, reducing the outgassing through a "bake out" process.

The known top heating system of the box coating apparatus "1200 DLX box coater" generally comprises two top heaters which are fixedly installed above a dome shaped substrate holder directly beneath the roof of the vacuum chamber, and each have an electrically powered joule effect serpentine resistor. The top heaters are hidden behind suitable fixed shields so as to be protected against contamination during the coating processes.

After this initial bake out process the box coating apparatus is ready for the leak rate measurement: the vacuum chamber is insulated from the pumping system (high vacuum valve shut off) and the pressure rate of rise is monitored for some minutes. The formula used for defining the leak rate value is as follows:

$$\text{leak rate} = (P1-P0) \times \text{Vol}/(T1-T0)[\text{Pa} \times \text{l/s}]$$

wherein T1 and T0 delimit the time frame of the experiment (e.g., T1–T0 may be 1800 s), whereas P1 and P0 are the pressure readings obtained at T1 and T0 through a vacuum gauge installed on the vacuum chamber, and with Vol as the volume of the vacuum chamber. For the box coating apparatus "1200 DLX box coater" typical good leak rate values may be below $2.5 \times 10^{-3}$ Pa×l/s. In case the leak rate values are below this limit the vacuum system has no problems from the vacuum point of view, and the box coating apparatus can be used for thin films PVD processes.

Values above this threshold suggest the presence of a leak big enough to negatively influence the quality of PVD processes. If a bad leak rate value is measured then the operator receives an alert message from the software and the leak needs to be manually found. In this case the operator will usually use a leak detector to find the leak. The leak detection procedure can be more or less time consuming and complicated depending on the position of the leak in the chamber. Depending on the kind of leak a small component substitution or a much more complex and important hardware/mechanical intervention on the vacuum system could be required. In any event the box coating apparatus can be operated again only after finding and removing the leak.

The above-described top heating system of the box coating apparatus can be used in extremely rare cases for some coating processes on glass lenses, is however primary required for 1) the leak testing method discussed above, where it serves to produce and emit heat radiation to heat up the walls of the vacuum chamber and the functional components contained therein, thereby "baking out" the vacuum chamber, or 2) some cleaning routines that use the same effect of stimulating surfaces outgassing by heat. Nevertheless, the known top heating system with its fixed shields that protect the two top heaters against undesired contamination and related malfunctions, always form a "rugged" interior surface portion of the vacuum chamber with undercut areas and winding gas or vapor ways. This "rugged" interior surface portion of the vacuum chamber however entails a certain gas/vapor flow resistance, so that the pumping down of the vacuum chamber to the above-mentioned process vacuum can be quite time-consuming. Naturally, it would be desirable in the mass production of spectacle lenses to minimize the time required by such non-productive sub-processes.

What is desired, starting from the prior art as outlined above, is a box coating apparatus for vacuum coating of substrates, in particular spectacle lenses, that has a simplified design and an enhanced pumping performance during both the pumping down phase prior to the deposition processes and the pumping down phase in preparation of vacuum check and cleaning routines. What is also desired is the provision of a related heating device that serves to heat up the vacuum chamber for use during vacuum check and cleaning routines.

SUMMARY OF THE INVENTION

According to one aspect of the invention, in case of a box coating apparatus for vacuum coating of substrates, in particular spectacle lenses, a vacuum chamber contains an evaporation source for evaporating coating material and a substrate holder for holding a plurality of substrates, that is disposed vis-à-vis to the evaporation source. In this fashion, a coating material evaporated by the evaporation source can impinge on substrates held by the substrate holder. An electric heating device is arranged in the vacuum chamber, which serves to heat up the vacuum chamber in case of vacuum check and cleaning routines. The heating device is provided with a stand constructed to be removable from the vacuum chamber, wherein the stand has a plurality of leg portions mounted to a base plate of the stand, which are sized and arranged at the base plate so that the heating device can be placed over and above the evaporation source.

Accordingly, by providing the heating device with its own movable i.e. removable stand, the heating device can be used, instead of the known state of the art fixed top heater system, for heating up the vacuum chamber during check routines (like leak rate tests procedures) or for stimulating surfaces outgassing (cleaning of the walls of the vacuum chamber and the functional components therein). For the actual coating processes however, the heating device can be removed from the vacuum chamber. Therefore, this concept allows for a more expeditious design of the box coating apparatus, where the heating device can be removed when not needed, and moreover it can be used for more than a single box coating apparatus if several box coaters are provided, as is usually the case in the large-scale production of spectacle lenses. Constructing the box coating apparatus in such a way also gives benefits in 1) the pumping performances (higher speed of pumping down the vacuum chamber) of the box coating apparatus because of a minor degassing surface due to both the possible absence of the heating device as a whole during coating processes, and the possible absence of any shields for the heating device during vacuum check and cleaning routines, as well as 2) machine maintenance of the box coating apparatus because of a minor coated surface that needs to be periodically cleaned. Note that the removable heating device will not get dirty because no thin films deposition will reach it, as contrasted to the known top heating system which—even if shielded—may get dirty after many deposition cycles. Both advantageous effects (reducing the pumping down time and reducing maintenance time/increasing the duty cycle) eventually lead to an overall increase of the productivity of the box coating apparatus.

Further, since the stand has the plurality of leg portions mounted to the base plate, which are sized and arranged at the base plate so that the heating device can be placed over and above the evaporation source, the heating device is a free-standing solution. As compared to a "hanging" arrangement at, e.g., any supporting part of the substrate holder, such free-standing solution is less cumbersome for an operator in particular.

Preferably, the heating device with its stand is constructed to be removably arranged at a central region of the vacuum chamber adjacent to the evaporation source. This results in a substantially uniform spacing of the heating device to the boundary walls of the vacuum chamber and the functional components contained therein. Such arrangement, as compared to the previously known approach with a top heating system in particular, provides for a much better heat distribution and thus reduced outgassing times.

With a view to short setup times in particular it is further preferred if the heating device includes an electrical connection for supplying energy to the heating device, wherein the electrical connection is constructed to be connected to a mating electrical connection within the vacuum chamber. For example, the electrical connection of the heating device may have a fast-electric-plug, whereas the mating electrical connection within the vacuum chamber may have a fast-electric-socket electrically contacted via an air-vacuum electric feed-through, or vice versa. This also has the advantage that the connection is substantially wear-free, as compared to any screw connection or the like, which is used several times.

Preferably, the stand of the box coating apparatus has a central axis, wherein at least one electric heating element is arranged about the central axis so as to uniformly emit thermal radiation in essentially radial directions with respect to the central axis. Again, such design provides for a very good heat distribution, namely in all radial directions, and thus reduced outgassing times. In other words, there is no reflector or the like that would direct the thermal radiation in just one or a few directions only.

Although, in principle, there could be just one central electric heating element in case that the central axis of the stand extends in a substantially vertical direction in an operational state of the heating device, it is preferred if the heating device has a plurality of electric heating elements uniformly distributed with respect to the central axis of the stand over a circumference of the stand. This also brings the individual electric heating element closer to the adjacent wall or functional component in the vacuum chamber, and thus enhances efficiency.

In accordance with another aspect of the invention, the configuration of the electric heating elements may be such that part of the electric heating elements are arranged at an acute angle with respect to the central axis so as to face upwards away from the central axis, while another part of the electric heating elements are arranged at an acute angle with respect to the central axis so as to face downwards away from the central axis. This arrangement, again, advantageously allows for a better heat distribution also to the top and the bottom of the vacuum chamber.

Basically, "bulb-shaped" heating lamps could be used as the electric heating elements of the heating device. With a view to a larger emitting length of the individual electric heating element, however, it is preferred if the at least one electric heating element is rod-shaped.

With a view to a stiff but lightweight design of the heating device in particular, it is preferred if the stand has an upper hub portion and a lower hub portion which are rigidly connected with each other by at least one frame bar, wherein the at least one electric heating element is supported between the upper hub portion and the lower hub portion. In this case the arrangement may be such that the electric heating elements are arranged in pairs of electric heating elements connected in series, wherein the pairs of electric heating elements are attached to the upper hub portion and the lower hub portion on a respective common circumference thereof, and wherein a middle hub portion is provided, which is rigidly connected with the upper hub portion and the lower hub portion via the at least one frame bar, and supports the electric heating elements of each pair of electric heating elements adjacent to a connecting point thereof. By choosing a larger diameter for the middle hub portion, as compared to the diameter of the upper and lower hub portions, the above-mentioned upwards/downwards configuration of the electric heating elements can thus easily be attained.

Again, with a view to a lightweight design but also with regard to maximizing the conductance towards the pumping system and thus reducing the time required for pumping down the vacuum chamber, the hub portions and/or the base plate can be provided with passage openings. Basically, for the same reasons, the hub portions can have a shape like a star as seen in a plan view, with an inner base section and outer arm sections extending therefrom, wherein the electric heating elements are attached to the respective hub portions inbetween adjacent arm sections. This also helps to protect the electric heating elements and their mechanical connections to the stand against damage.

With a view to even greater protection against damage it is further preferred if two protection bars are assigned to each electric heating element, which are arranged at positions where they protect the respective electric heating element against mechanical impact, and essentially without obstructing the thermal radiation radially emitted from the respective electric heating element. In this case, the protection bars are preferably attached to free ends of the outer arm sections of the hub portions, thereby forming kind of a cage for the electric heating elements.

In a preferred embodiment the heating device further has a central post that is arranged and extends through the hub portions, wherein the central post is tubular in shape in order to accommodate electrical wiring for the electric heating elements. Thus, one and the same part, namely the central post, stiffens the stand and at the same time protects the electrical wiring against mechanical and heat damage.

Furthermore, the stand of the heating device can advantageously be provided with at least one handle that allows to move and position the heating device, thereby improving and facilitating the handling of the heating device by an operator.

Finally, preferably the at least one electric heating element is an electric infrared quartz lamp. Such lamps are especially suitable to be used under vacuum, and easily and cost-effective available on the market, e.g. as the industrial lamp type 13168X from Philips Lighting, Netherlands, having a lamp wattage of 2,000 W and an operating voltage of 235 V. These lamps warm up quickly by electrical current induced joule effect, and after warming up emit electromagnetic radiation in the IR (infrared) range. IR irradiation is then the working principle through which thermal energy is transmitted to the walls of the vacuum chamber and to the other functional components inside it. However, it would also be possible to use a joule effect serpentine resistor type heater centrally arranged in the vacuum chamber on a removable stand.

BRIEF DESCRIPTION OF THE DRAWINGS

The invention is explained in more detail in the following by way of a preferred embodiment of a box coating apparatus for vacuum coating of substrates such as spectacle lenses, and by way of a preferred embodiment of a removable heating device adapted to be used with such box coating apparatus, with reference to the accompanying, partly simplified or schematic drawings. In the drawings.

Figure 1:
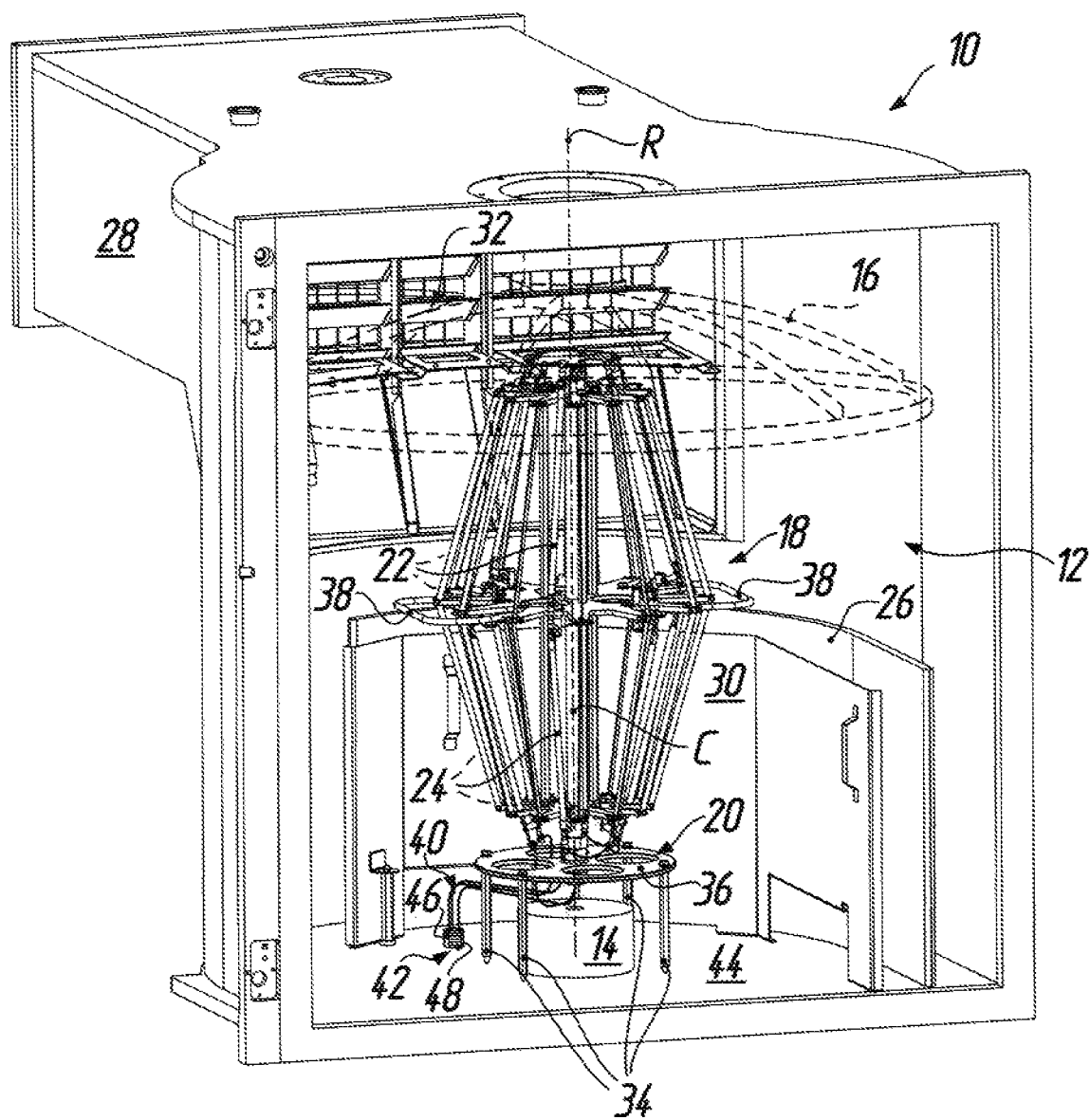
FIG. 1 shows a perspective view of a box coating apparatus according to the invention for, in particular, vacuum coating of spectacle lenses as substrates that can be movably held by a dome shaped substrate holder (depicted in broken lines) about a central axis of rotation vis-à-vis to an evaporation source in a vacuum chamber, obliquely from above and front left, wherein a heating device with a stand is removably placed in a central position of the vacuum chamber above the evaporation source.

As to FIG. 1, it is to be noted at this point that for simplification of the illustration, apart from parts of the cladding, walls and door of the box coating apparatus, the electron beam gun with shutter, the operating unit and control system (electrical cabinet), screens, handling devices and deposits for the substrates and consumables, the supply and conditioning devices—inclusive of lines, hoses and pipes—for current (transformers), compressed air, vacuum (high vacuum pump set) and cooling water (water thermo conditioner, cascade cooler, water chiller) as well as the measuring, maintenance and safety devices, in particular, were also mostly omitted from FIG. 1, in every instance to the extent that they are not required for understanding of the invention. These omitted parts, assemblies and devices, in structure and function, are already known to the person ordinarily skilled in the art.

DETAILED DESCRIPTION OF THE PREFERRED EMBODIMENT

A box coating apparatus for vacuum coating of substrates (not shown in the drawings), particularly spectacle lenses, is denoted by 10 in FIG. 1. The box coating apparatus 10 has a vacuum chamber 12 which contains an evaporation source 14 and a substrate holder 16 (shown in broken lines in FIG. 1 only as it or parts thereof are usually removed from the vacuum chamber 12 once leak rate test procedures are being carried out) for holding a plurality of substrates. The substrate holder 16, in a manner as is known from, e.g., the above-mentioned box coating apparatus "1200-DLX box coater", is formed as a dome disposed vis-à-vis to the evaporation source 14 and rotatable by a dome rotary drive (not shown) about an axis of rotation R which passes through the evaporation source 14. Thus, substrates held by the substrate holder 16 in a known manner on a plurality of circles can be moved on circular paths about the axis of rotation R with a respective constant spacing relative to the evaporation source 14, while the coating material evaporated by the evaporation source 14 can impinge on the substrates held by the substrate holder 16.

According to an essential feature, an electric heating device 18 is arranged in the vacuum chamber 12, which serves to heat up the vacuum chamber 12 in case of vacuum check and cleaning routines, as have been discussed in the introductory part of the description already. As will be explained in more detail below, the heating device 18 is provided with a stand 20 to be adapted to be removable from the vacuum chamber 12, when not required, i.e. during the actual coating processes in particular.

Further, the heating device 18 as such is designed in a way that electric heating elements 22, 24 thereof are arranged about a central axis C of the stand 20 so as to uniformly emit thermal radiation in essentially radial directions with respect to the central axis C, as will be discussed below as well.

As to the further structure of the box coating apparatus 10, FIG. 1 shows a Meissner trap 26 that is located in the vacuum chamber 12 and serves in a manner known per se to trap free water vapor in the vacuum chamber 12 by freezing water molecules to the trap surface, so that the time required for pumping down the vacuum chamber 12 can be reduced. Furthermore, the box coating apparatus 10 has a chamber appendage 28 to the vacuum chamber 12—also known as "high vacuum valve region" of the box coating apparatus 10—in which a high vacuum valve mechanism (not shown) is mounted. Since the Meissner trap 26 and the high vacuum valve mechanism are sensitive to thin film depositions, full and fixed shields 30, 32 are provided in the vacuum chamber 12 at positions facing the evaporation source 14 so as to shield the respective equipment against the evaporant particles travelling through the vacuum chamber 12 during the coating process. Whereas the shield 30 forms a continuous wall in front of the Meissner trap 26, the shield 32 for the high vacuum valve mechanism is arranged at the entrance of the chamber appendage 28 and formed like a lamella grid with a fixed lamella angle so that the respective lamella portions directly face the evaporation source 14. Instead of full and fixed shields for protecting the sensitive components of the box coating apparatus, shield arrangements (not shown) may be provided that can selectively be opened or closed depending on the respective process status, as disclosed in the copending European patent application 17 000 280.2 filed on 22 Feb. 2017 by the same applicant which is hereby incorporated by reference.

Turning to the heating device 18 in connection with FIG. 1 once more, which illustrates the operational state of the heating device 18 in which the central axis C thereof extends in a substantially vertical direction, FIG. 1 clearly shows that the heating device 18 with its stand 20 in shape and dimensions is adapted to be removably arranged at a central region of the vacuum chamber 12 adjacent to the evaporation source 14. In this position the central axis C of the heating device 18 is essentially aligned with the axis of rotation R of the substrate holder 16. Therefore, the heating device 18, as seen in radial directions with respect to the central axis C, is substantially equally spaced from the surrounding walls in the vacuum chamber 12.

It can further be taken from FIG. 1 that the stand 20 has a plurality of leg portions 34 (four in the example shown) mounted to a base plate 36 of the stand 20, which are sized and arranged at the base plate 36 so that the heating device 18 can be placed over and above the evaporation source 14. To serve this purpose, the stand 20 in the example shown is also provided with two handles 38 on opposing sides of the stand 20, which allow to freely move and position the heating device 18 in the vacuum chamber 12, or to remove the heating device 18 from the vacuum chamber 12 and transport it to another box coating apparatus or to a storage space, as the case may be.

Moreover, according to FIG. 1 in particular, the heating device 18 comprises an electrical connection 40 for supplying energy to the heating device 18, which is adapted to be connected to a mating electrical connection 42 arranged within the vacuum chamber 12, namely in a bottom area 44 thereof in front of the shield 30 for the Meissner trap 26. To be more precise, the electrical connection 40 of the heating device 18 comprises a fast-electric-plug 46, whereas the mating electrical connection 42 within the vacuum chamber 12 has a fast-electric-socket 48 electrically contacted from the outside via an air-vacuum electric feed-through (not shown), offering a reliable, durable and easy hook up for "plug and run" installation of the heating device 18 in the vacuum chamber 12.

Further details of the heating device 18 will now be described with reference to FIGS. 2 to 14C. In doing so the various parts of the heating device 18 will not be denoted with reference signs at each and every occurrence in the drawings so as to not overload the drawings with reference signs. In this context it is noted however that the heating device 18 has a large number of identical parts which are symmetrically arranged about the central axis C of the stand 20 so that the person ordinarily skilled in the art will be in the position to identify the respective parts in the various perspective views in particular, even if not denoted with reference signs.

Figure 2:
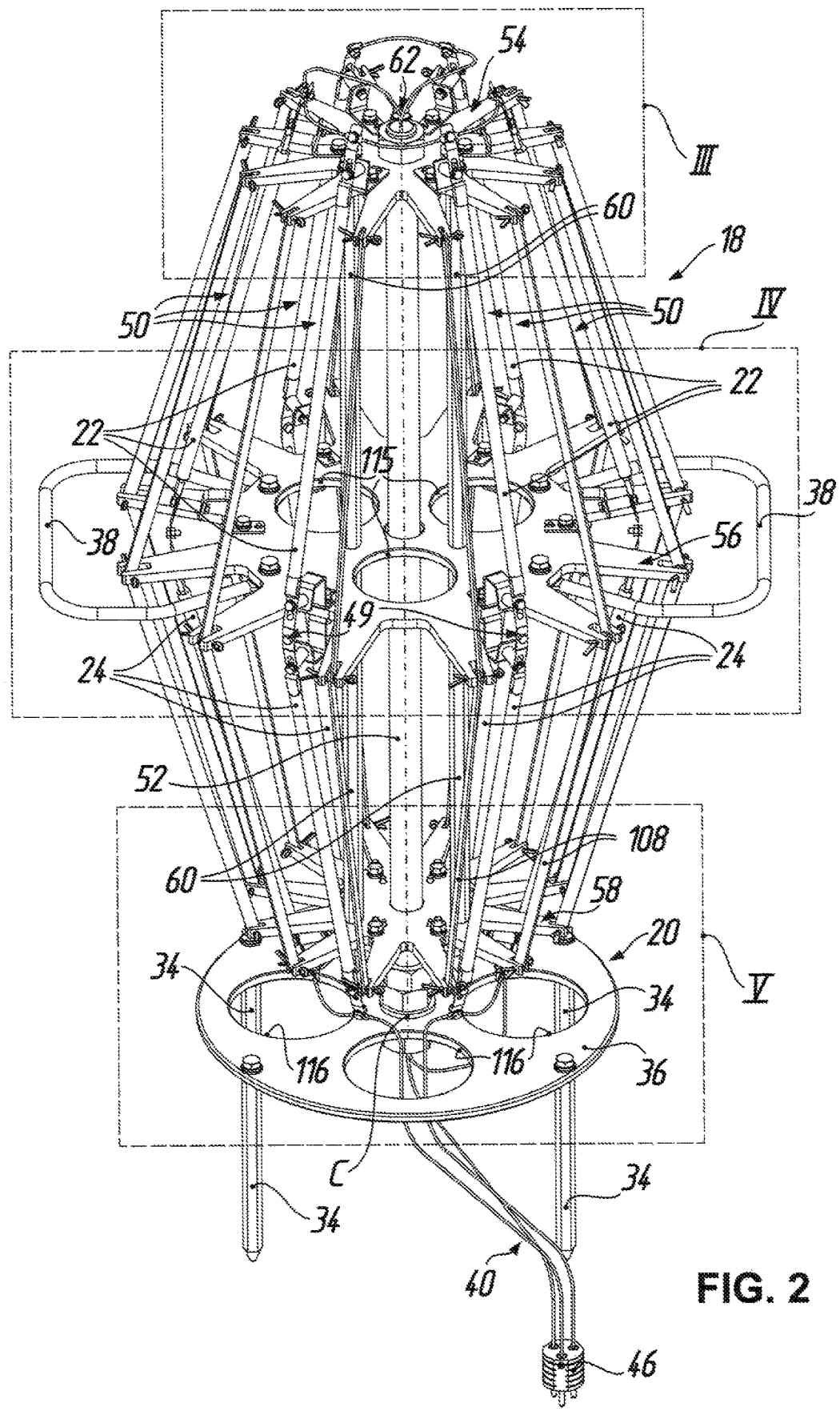
FIG. 2 shows a perspective view, to an enlarged scale, of the removable heating device according to FIG. 1 obliquely from above and front, in a state removed from the box coating apparatus according to FIG. 1.
Figure 3:
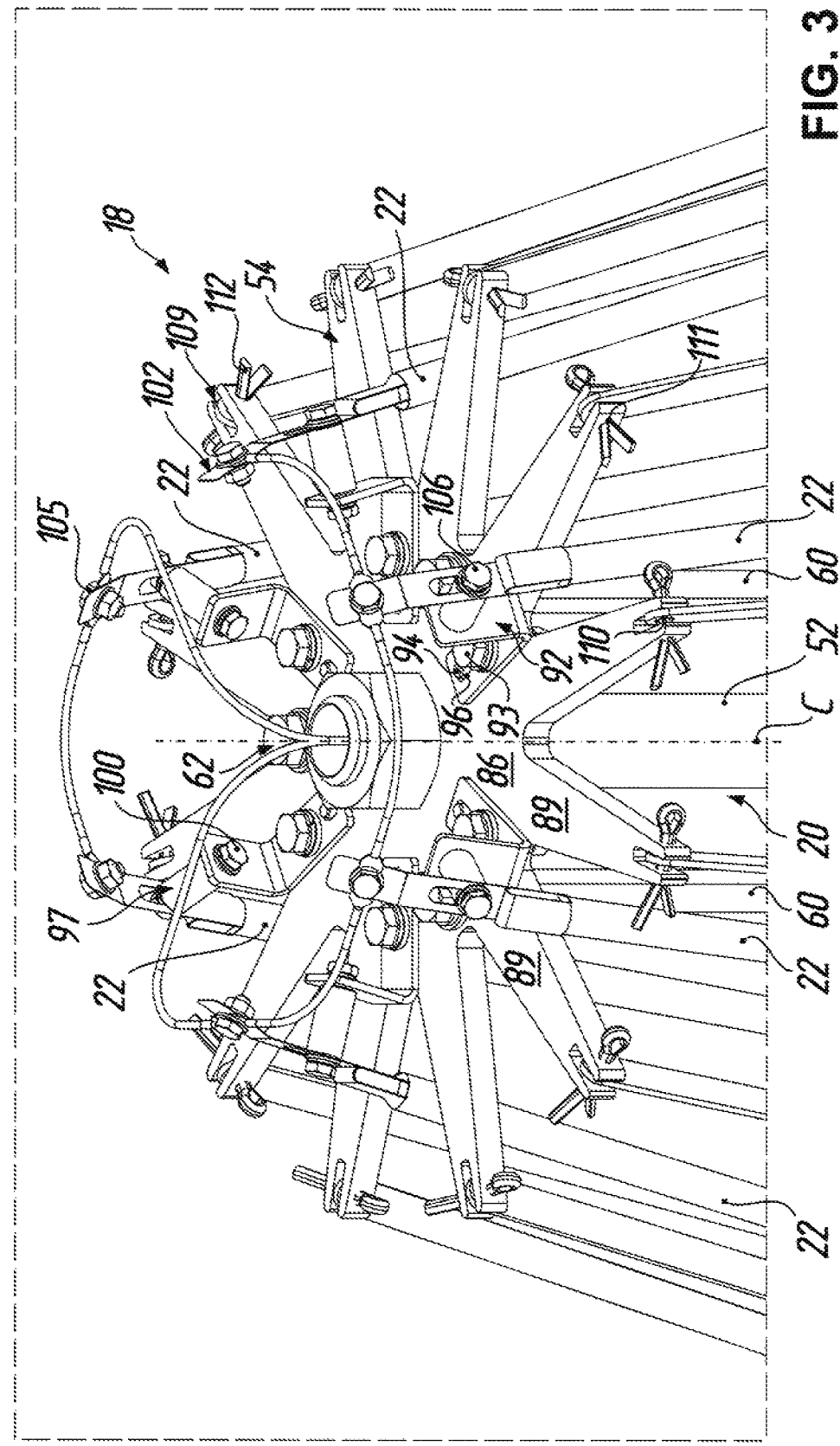
FIG. 3 shows a perspective view, to a further enlarged scale, of the removable heating device according to FIG. 1 in correspondence with the detail III in FIG. 2.
Figure 4:
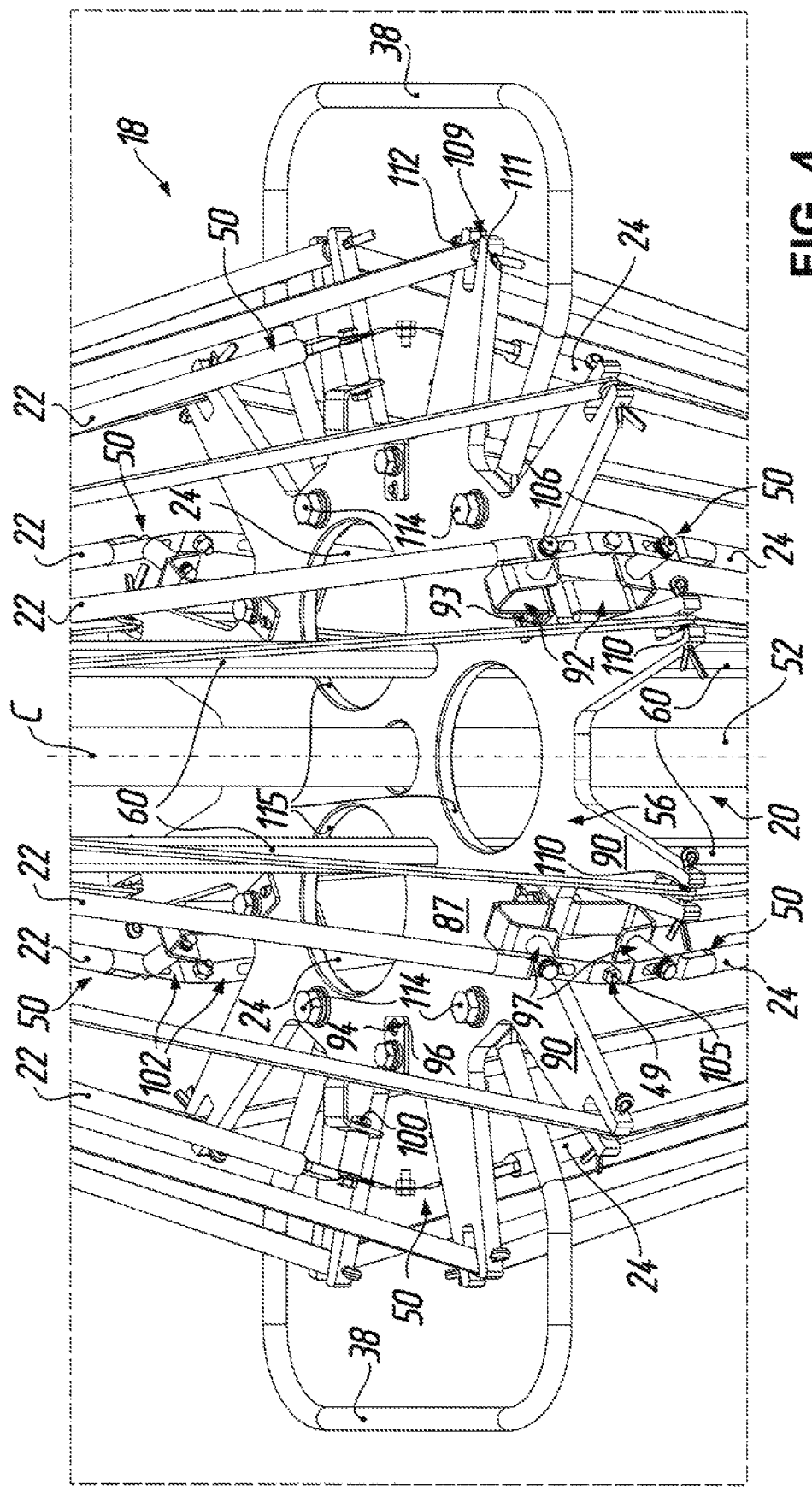
FIG. 4 shows a perspective view, to a further enlarged scale, of the removable heating device according to FIG. 1 in correspondence with the detail IV in FIG. 2.
Figure 5:
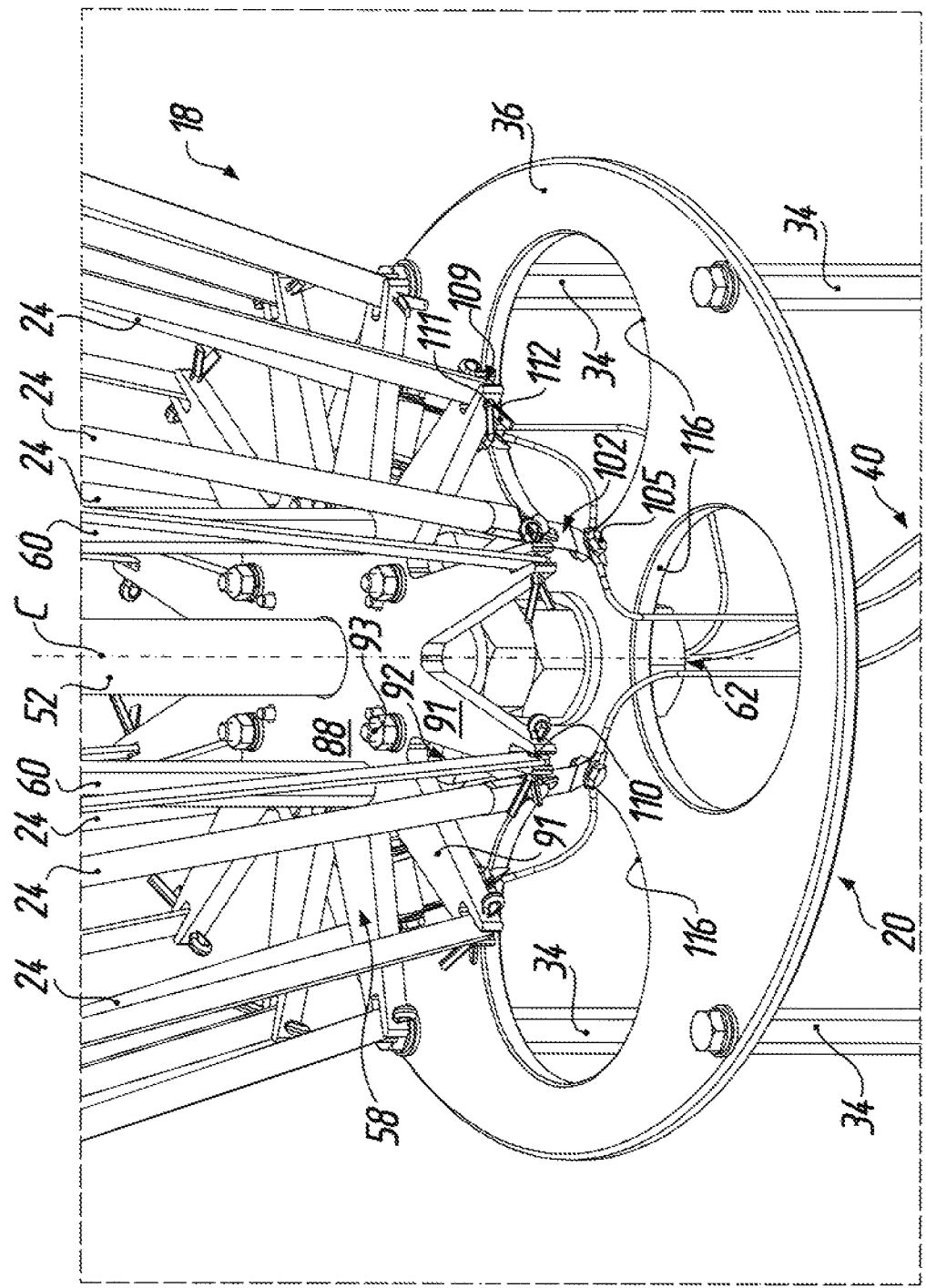
FIG. 5 shows a perspective view, to a further enlarged scale, of the removable heating device according to FIG. 1 in correspondence with the detail V in FIG. 2.
Figure 6:
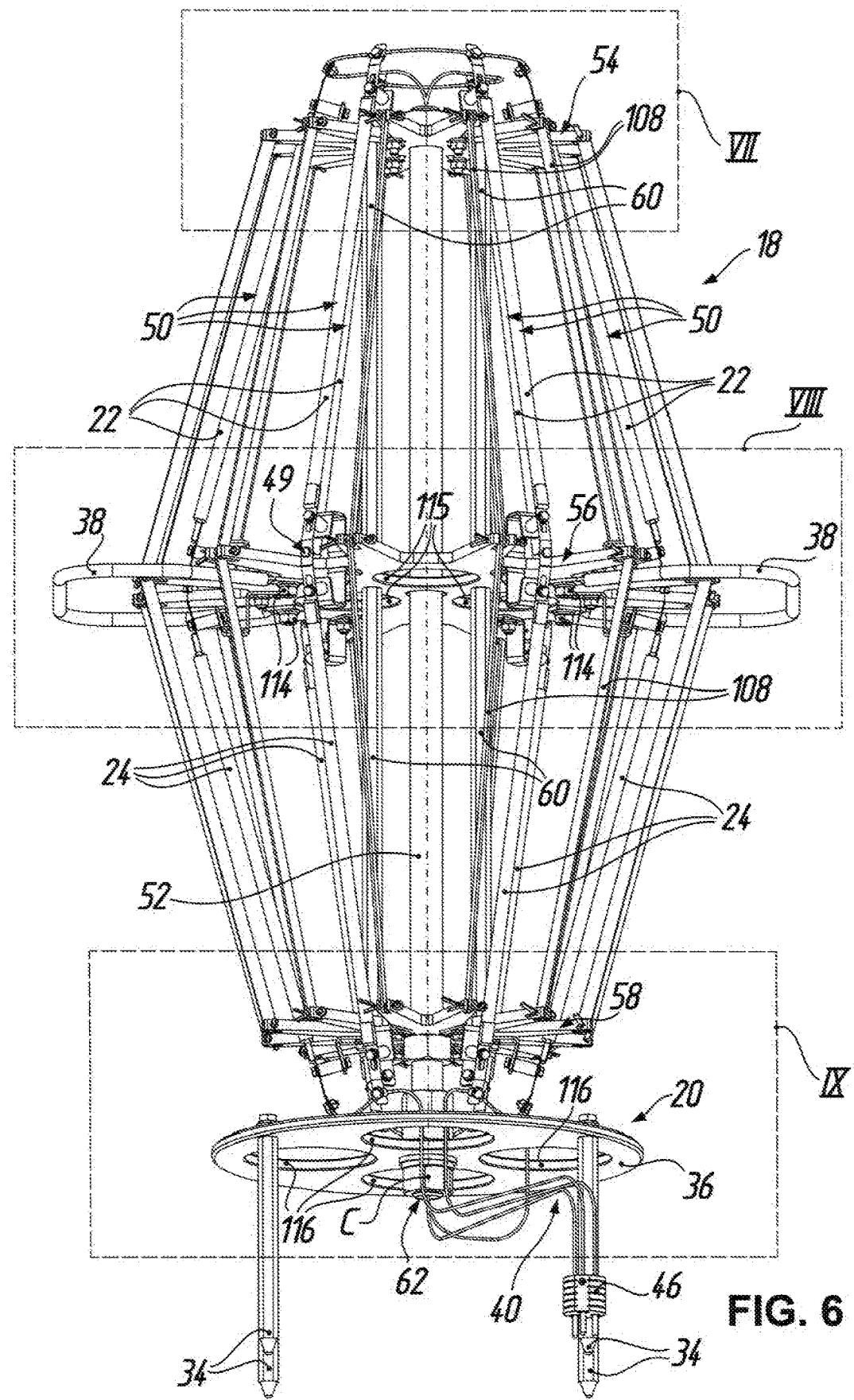
FIG. 6 shows a perspective view, to an enlarged scale, of the removable heating device according to FIG. 1 obliquely from below and front, in a state removed from the box coating apparatus according to FIG. 1.
Figure 7:
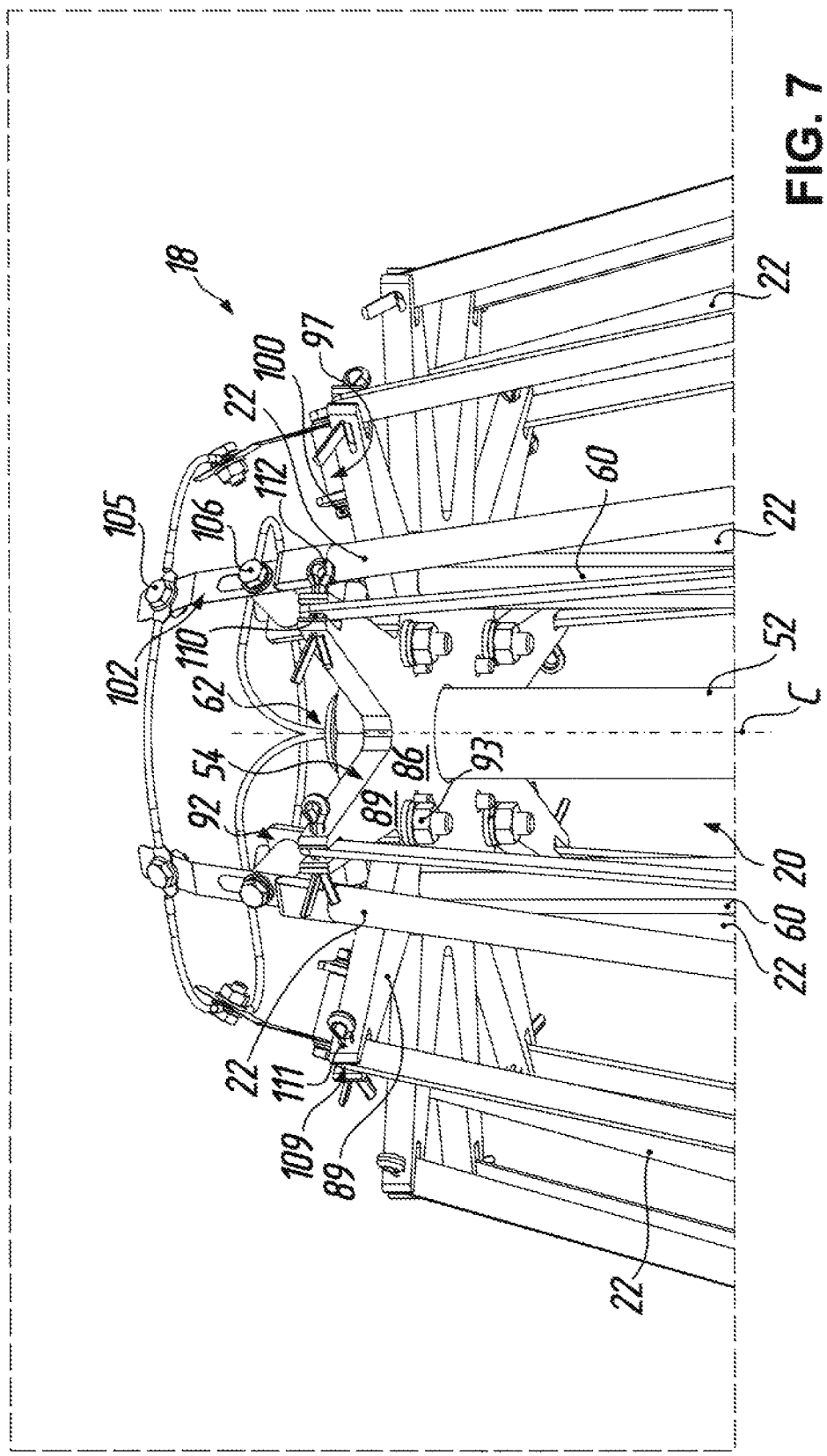
FIG. 7 shows a perspective view, to a further enlarged scale, of the removable heating device according to FIG. 1 in correspondence with the detail VII in FIG. 6.

First of all, as can best be seen in FIGS. 2 and 6, the heating device 18 has a plurality of electric heating elements 22, 24 uniformly distributed with respect to the central axis C of the stand 20 over a circumference of the stand 20. To be more precise, in the present embodiment the heating device 18 has twelve electric heating elements 22, 24 in total, namely electric infrared quartz lamps, which are identical in power and shape, i.e. rod-shaped in this case. The electric heating elements 22, 24 are arranged in six pairs 50, wherein the electric heating elements 22, 24 of each pair 50 are connected in series at connecting points 49. The six pairs 50 of electric heating elements 22, 24 are then interconnected and electrically connectable via the fast-electric-plug 46 in a three phase system (not shown), wherein the three phases only are connected in a triangle configuration.

As to the mechanical structure of the heating device 18, the pairs 50 of electric heating elements 22, 24 are mounted on the stand 20 in a way that, as seen from above in a circumferential direction about the central axis C (cf. FIG. 12), each pair 50 of electric heating elements 22, 24 is angularly spaced from the next pair 50 of electric heating elements 22, 24 by an angle of 60° about the central axis C. Further, as seen in the height and radial directions with respect to the central axis C (see FIGS. 2 and 6), the electric heating elements 22, 24 of each pair 50 are mounted to form an obtuse angle. In other words, the electric heating elements 22, 24 of the pairs 50 together define an envelope of double-conical shape. As a consequence of this, part of the electric heating elements 22, 24 (i.e. the six upper electric heating elements 22) are arranged to radially emit from the heating device 18 to a greater extent thermal radiation in an upward direction at an acute angle with respect to the central axis C, while another part of the electric heating elements 22, 24 (i.e. the six lower electric heating elements 24) are arranged to radially emit from the heating device 18 to a greater extent thermal radiation in a downward direction at an acute angle with respect to the central axis C.

Figure 10:
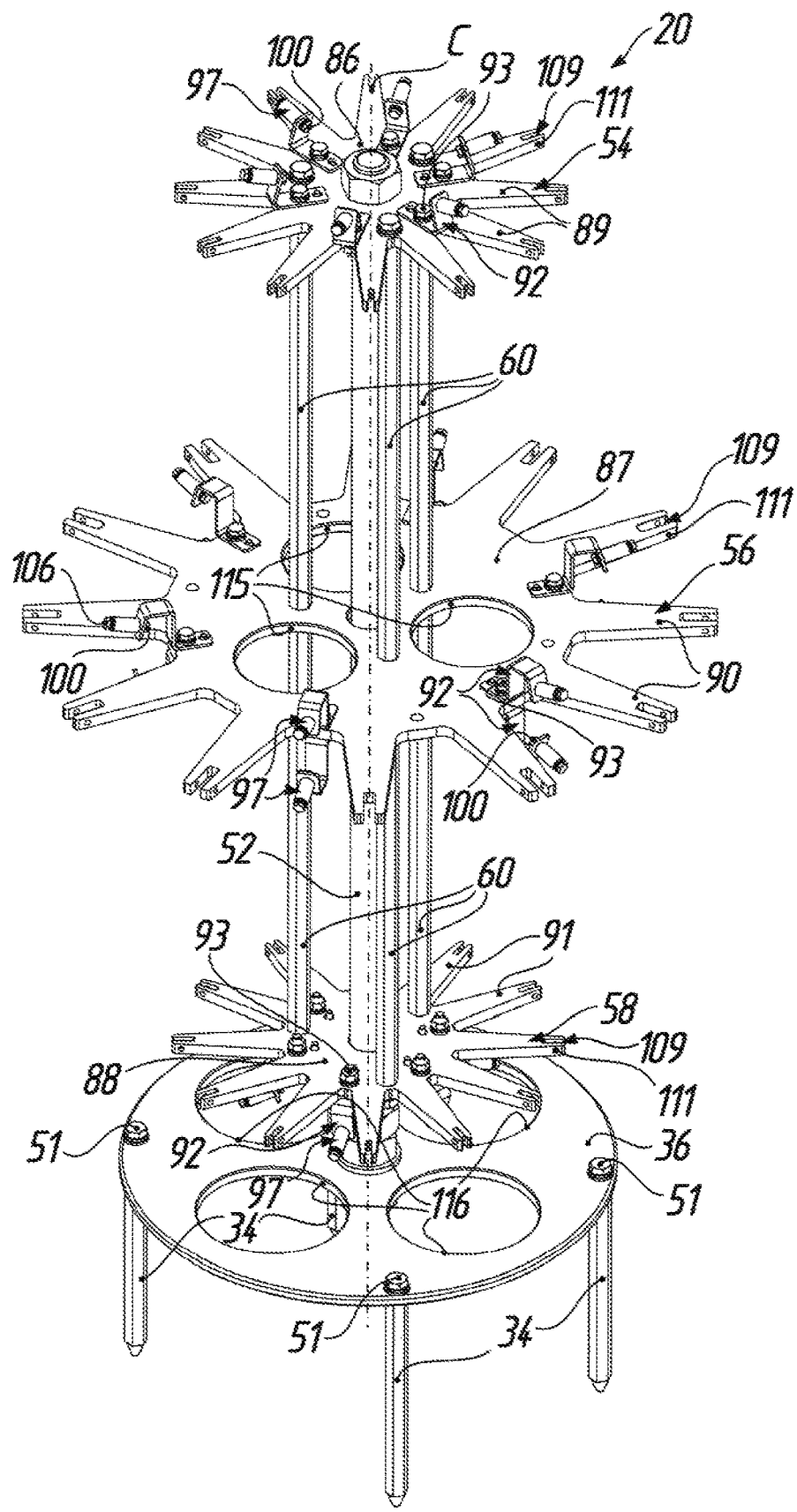
FIG. 10 shows a perspective view, to an enlarged scale, of a support structure of the stand of the removable heating device according to FIG. 1 obliquely from above and front right, in a state removed from the box coating apparatus according to FIG. 1, wherein rod-shaped electric infrared quartz lamps, assigned protection bars, their fasteners, and electric connections of the quartz lamps of the heating device have been omitted for a better illustration of the support structure.
Figure 11:
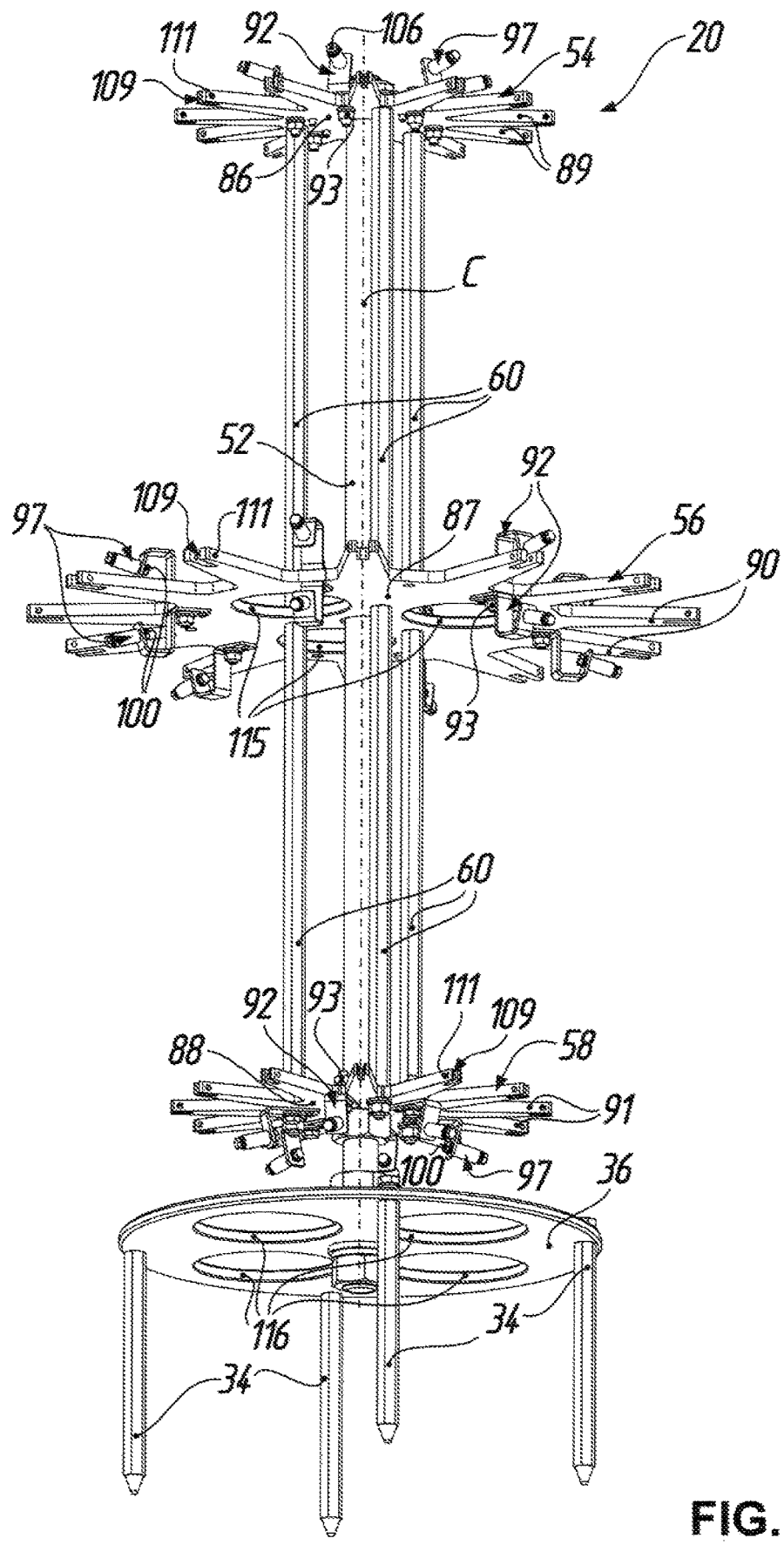
FIG. 11 shows a perspective view, to an enlarged scale, of the support structure of the stand of the removable heating device according to FIG. 1 obliquely from below and front right, in a state removed from the box coating apparatus according to FIG. 1, with the simplifications of FIG. 10, again for a better illustration of the support structure.
Figure 12:
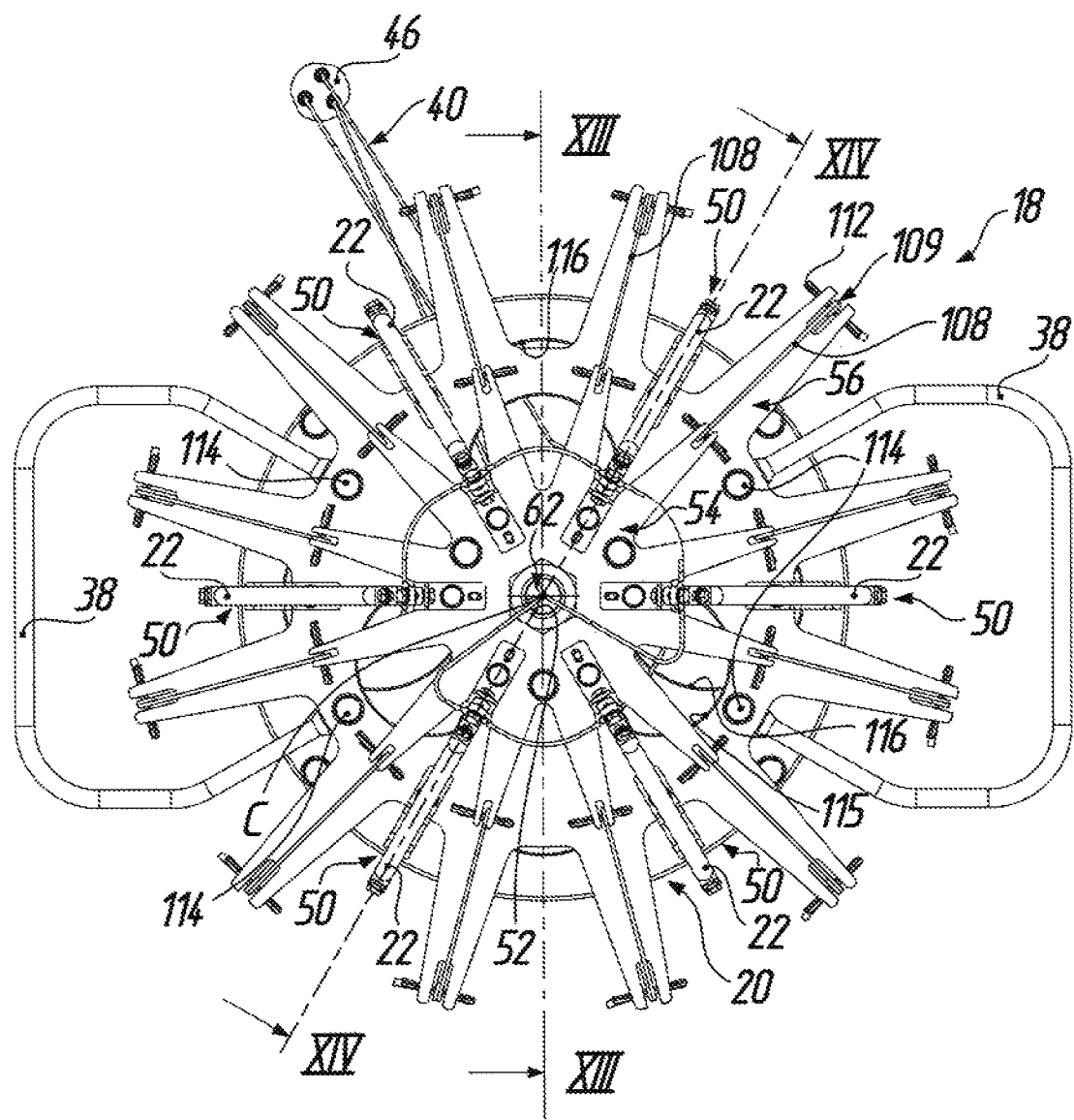
FIG. 12 shows a top view, to an enlarged scale, of the removable heating device according to FIG. 1, in a state removed from the box coating apparatus according to FIG. 1.

As can be taken from FIGS. 10 and 11 in particular, besides the leg portions 34 and the base plate 36, which are attached to each other by screw connections at 51 in FIG. 10, the main elements of the stand 20—all made from stainless steel—include a central post 52, an upper hub portion 54, a middle hub portion 56, a lower hub portion 58 and six frame bars 60.

According to FIGS. 13A to 14C, the central post 52 is tubular in shape in order to accommodate and serve as a cable feed-through for electrical wiring 62 for the electric heating elements 22, 24. It is further arranged and extends through the hub portions 54, 56, 58. To be more precise, the upper and lower end portions of the central post 52 are each provided with an external thread 64, 66. The lower end portion of the central post 52 extends through a central mounting bore 68 in the base plate 36 and is fixed in place via a nut 70 screwed onto the external thread 66, a retaining ring 71 and a washer 72 from below, as well as another washer 73, a further nut 74 and a counter nut 75 screwed onto the external thread 66 above the base plate 36. Above the counter nut 75 another nut 76 is screwed onto the lower external thread 66, which serves to axially support the lower hub portion 58 at the central post 52. The central post 52 then extends tightly through a central locating bore 77 in the lower hub portion 58 (see FIGS. 13C, 14C) and with radial play through a central passage bore 78 in the middle hub portion 56 (cf. FIGS. 13B, 14B) until it again tightly passes through a central locating bore 79 in the upper hub portion 54 (see FIGS. 13A, 14A), where a further nut 80 is screwed onto the external thread 64 of the central post 52 to pull the upper hub portion 54 and the lower hub portion 58 together.

Figure 13A:
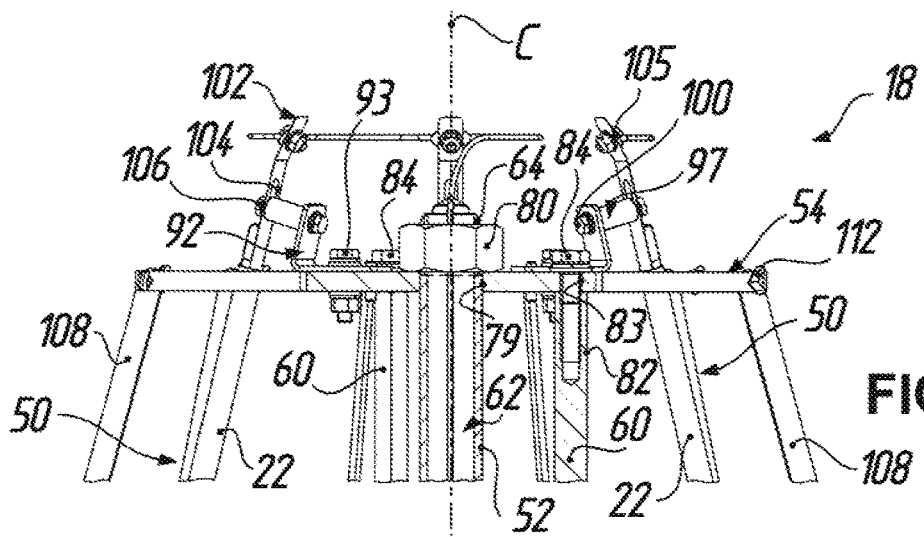
FIG. 13A to FIG. 13C show cut-out sectional views, to a further enlarged scale, of the removable heating device according to FIG. 1 in correspondence with the section line XIII-XIII in FIG. 12.
Figure 13B:
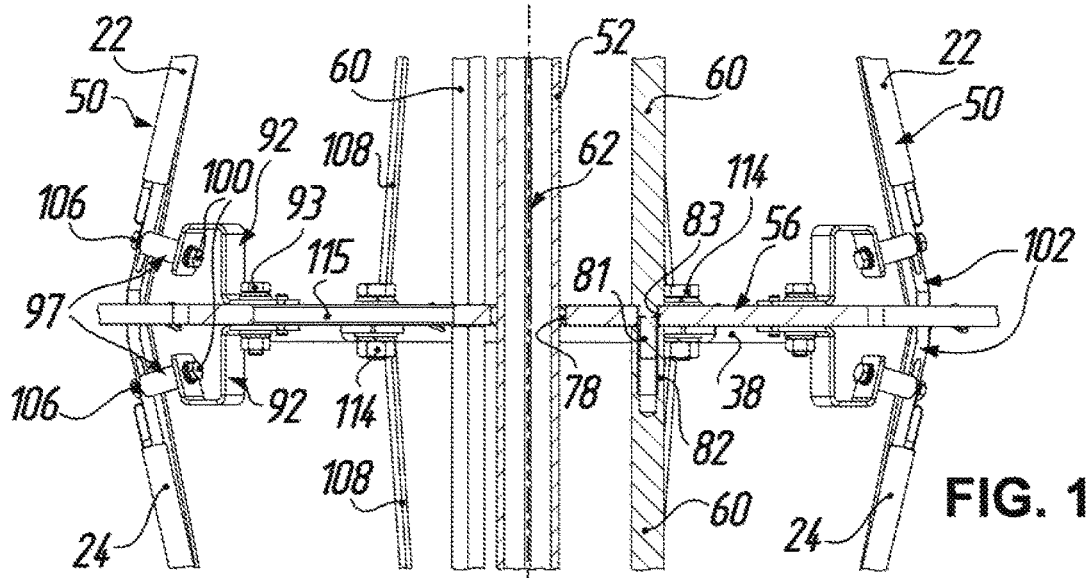
Figure 13C:
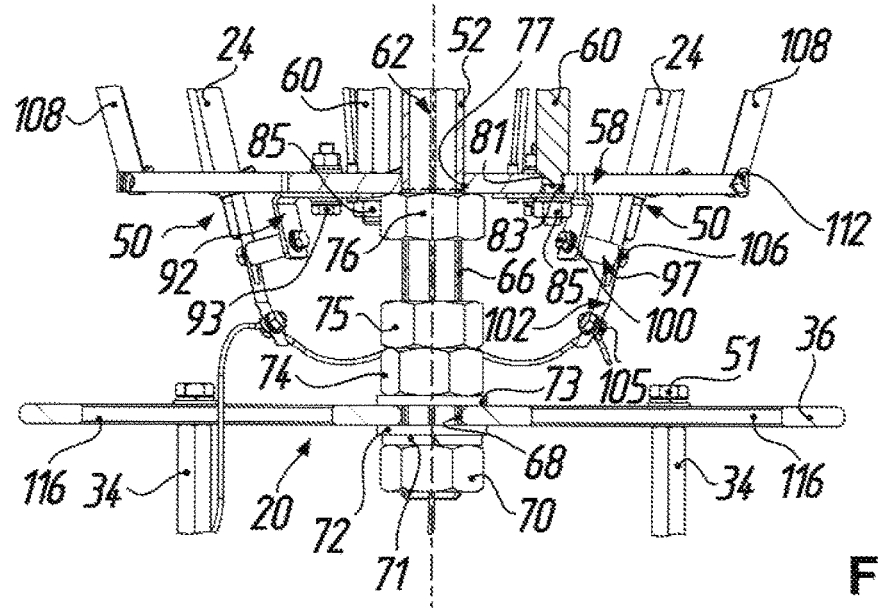

At the same time, the upper hub portion 54, the middle hub portion 56 and the lower hub portion 58 are rigidly connected with each other by the six frame bars 60, as is shown in FIGS. 13A to 13C. The frame bars 60, which—as the leg portions 34—have a hexagonal cross section to form a keying surface for open-end spanner installation, each comprise a male thread end 81 and a female thread end 82. Further, each hub portion 54, 56, 58 has three mounting bores 83 on the same diameter and spaced from each other by an angle of 120° about the central axis C. According to FIG. 13A, bolts 84 are passed through the mounting bores 83 of the upper hub portion 54 and screwed into the female thread ends 82 of the upper frame bars 60. Likewise, the male thread ends 81 of the upper frame bars 60 are passed through the mounting bores 83 of the middle hub portion 56 and screwed into the female thread ends 82 of the lower frame bars 60, as shown in FIG. 13B. Finally, according to FIG. 13C, the male thread ends 81 of the lower frame bars 60 are passed through the mounting bores 83 in the lower hub portion 58, where nuts 85 are screwed onto the male thread ends 81 of the lower frame bars 60. As is evident from the foregoing description, the support structure of the stand 20 with its parallel extending central post 52 and frame bars 60 is very stiff, wherein the latter also prevent relative rotation between the hub portions 54, 56, 58 about the central axis C.

As can further be taken from FIGS. 10 and 11, the hub portions 54, 56, 58 are substantially star-shaped as seen in a plan view, with an inner base section 86, 87, 88 and outer arm sections 89, 90, 91 (twelve in each case) extending therefrom. According to FIGS. 3 to 5 and 7 to 9 in particular, the electric heating elements 22, 24 are attached to the respective hub portions 86, 87, 88 inbetween adjacent arm sections 89, 90, 91. To this end, suitably bent mounting brackets 92 are attached to the respective inner base section 86, 87, 88 of the hub portions 54, 56, 58 by screw connections 93. According to FIGS. 14A to 14C in particular, the mounting brackets 92 are secured against rotation about the respective screw connection 93 by a pin 94 assigned to each mounting bracket 92 at the upper hub portion 54 and the lower hub portion 58, respectively, or assigned to a pair of opposing mounting brackets 92 in case of the middle hub portion 56. Each pin 94 is press-fitted into an assigned mounting bore 95 of the respective hub portion 54, 56, 58 (cf. FIGS. 14A to 14C) and extends through an associated elongated locating bore 96 in the related mounting bracket 92.

Figure 14A:
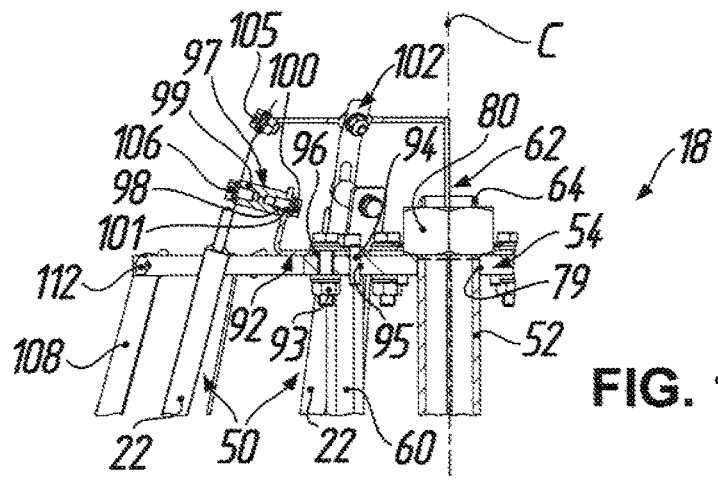
FIG. 14A to FIG. 14C show cut-out sectional views, to a further enlarged scale, of the removable heating device according to FIG. 1 in correspondence with the section line XIV-XIV in FIG. 12 with only a left side shown for better illustrating the support structures.
Figure 14B:
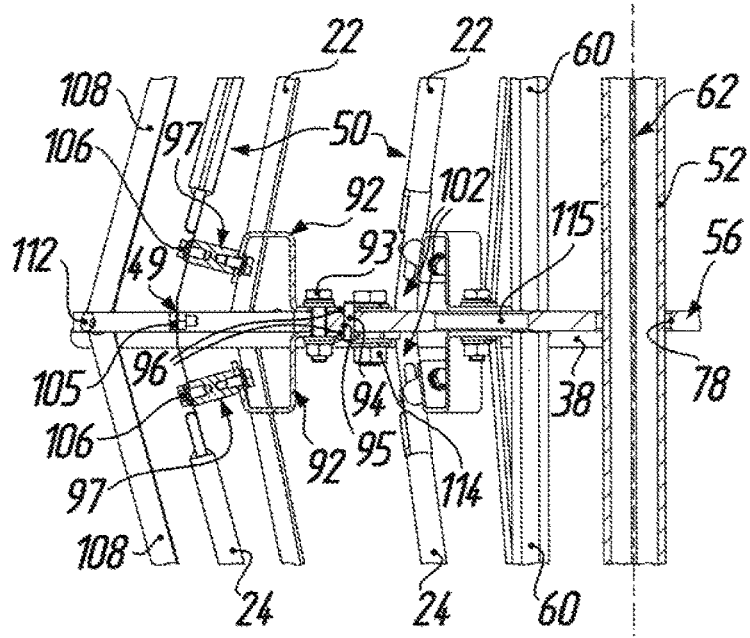
Figure 14C:
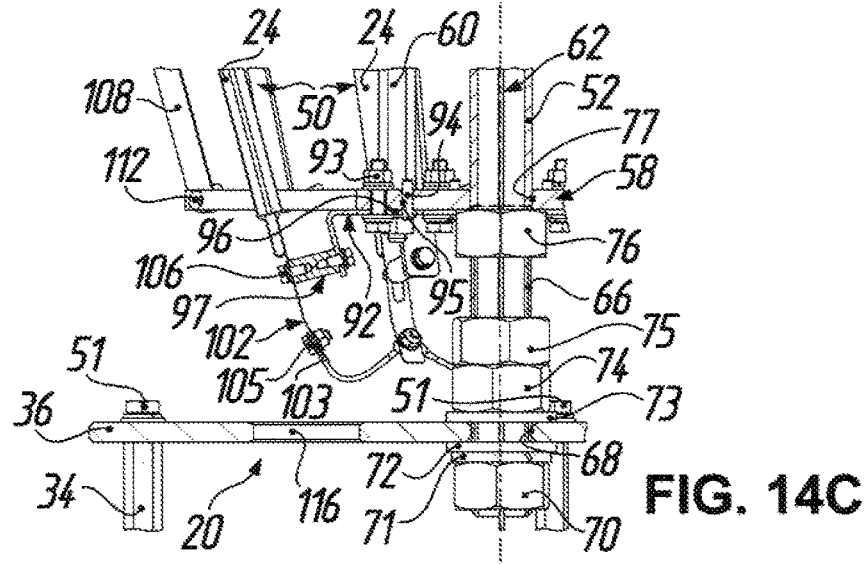

At its respective free end each mounting bracket 92 carries an isolator sleeve 97 that has opposing female thread ends 98, 99, as can be seen in FIGS. 14A to 14C. A bolt 100 is passed through a mounting bore 101 at the free end of each mounting bracket 92 and is screwed into the female thread end 98 of the related isolator sleeve 97 to securely fix the latter to the respective mounting bracket 92 (see FIG. 14A). Further, each electric heating element 22, 24 has contact tabs 102 at both ends which are each provided with an outer contact bore 103 (cf. FIG. 14C) and an inner elongated mounting bore 104 (see FIG. 13A). The contact bores 103 serve to hook up the electrical wiring 62 of the heating device 18 to the electric heating elements 22, 24 and to interconnect the latter at the connecting points 49 with the aid of screw connections 105, whereas the mounting bores 104 serve to mechanically fix the electric heating elements 22, 24 to the stand 20. To be more precise, bolts 106 are provided which extend to the mounting bores 104 of the contact tabs 102 and are screwed into the female thread ends 99 of the isolator sleeves 97 (see FIGS. 14A to 14C) in order to fasten the respective contact tab 102 to the related isolator sleeve 97 and thus firmly hold the respective electric heating element 22, 24 in place.

As a result, as can be seen in FIGS. 2 and 6 in particular, the pairs 50 of electric heating elements 22, 24 are supported between and attached to the upper hub portion 54 and the lower hub portion 58 on a respective common circumference thereof, while the middle hub portion 56 supports the electric heating elements 22, 24 of each pair 50 of electric heating elements 22, 24 adjacent to the connecting point 49 thereof on a common circumference of the middle hub portion 56 as well. On account of the varying mounting diameters at the different hub portions 54, 56, 58 the double-conical general appearance of the heating device 18 results.

Further, according to FIGS. 2 to 9, two protection bars 108 are assigned to each electric heating element 22, 24, i.e. twenty-four protection bars 108 in total, which are arranged at positions where they protect the respective electric heating element 22, 24 against mechanical impact, and essentially without obstructing the thermal radiation radially emitted from the respective electric heating element 22, 24. To be more precise, the protection bars 108, which are made of flat strip material of stainless steel, are attached to the free ends of the outer arm sections 89, 90, 91 of the hub portions 54, 56, 58. To this end, the free ends of the arm sections 89, 90, 91 are provided with slits 109 for accommodating the ends of the protection bars 108, which are each provided with a transverse mounting hole 110, as can be seen in FIGS. 3 to 5 and 7 to 9. Likewise, the free ends of the arm sections 89, 90, 91 are each provided with a transverse bore 111 in the area of the respective slit 109. Cotter pins 112 are inserted into and extend through the respective transverse bores 111 in the arm sections 89, 90, 91, thereby passing through the related transverse mounting holes 110 of the protection bars 108 in order to securely fasten the latter to the hub portions 54, 56, 58.

Figure 8:
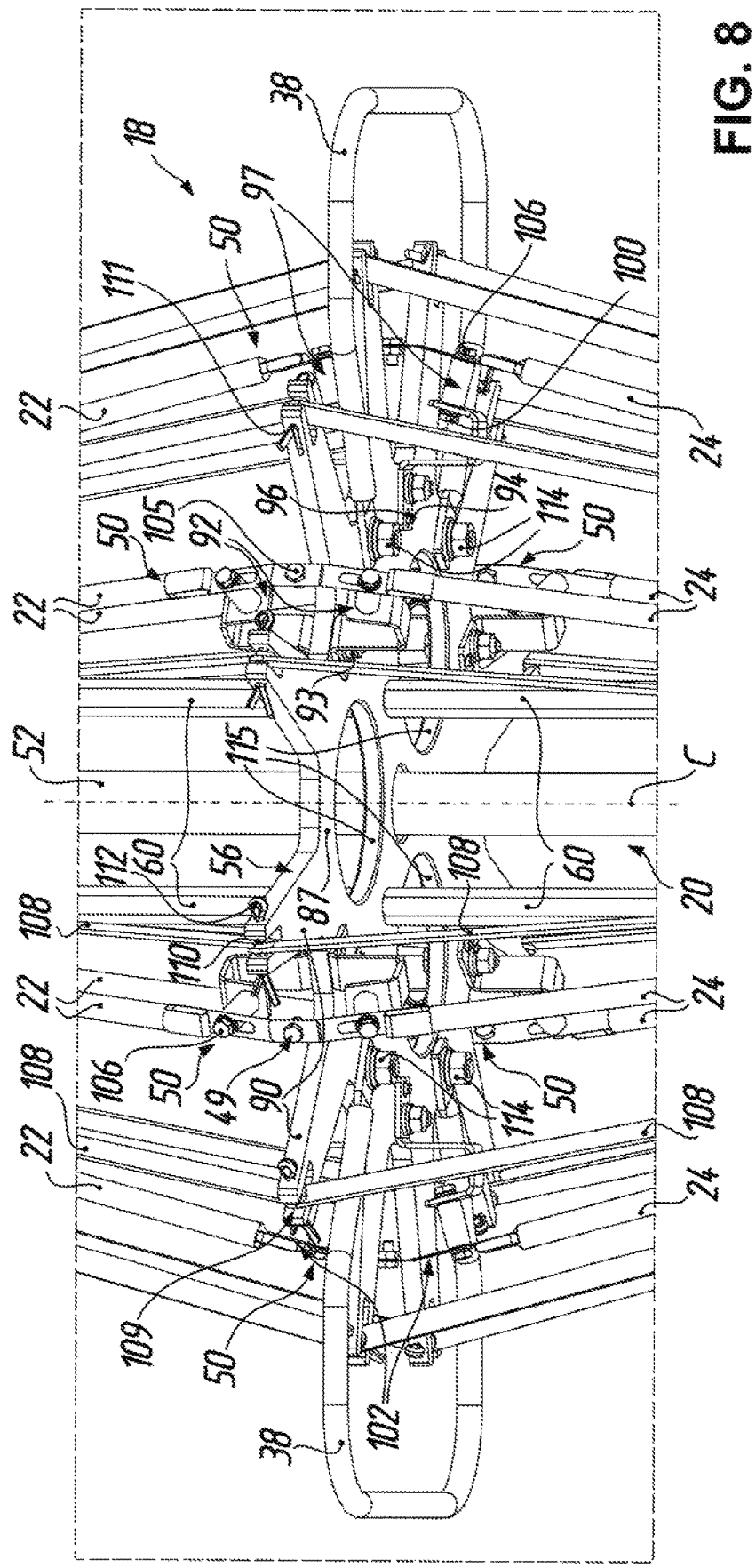
FIG. 8 shows a perspective view, to a further enlarged scale, of the removable heating device according to FIG. 1 in correspondence with the detail VIII in FIG. 6.
Figure 9:
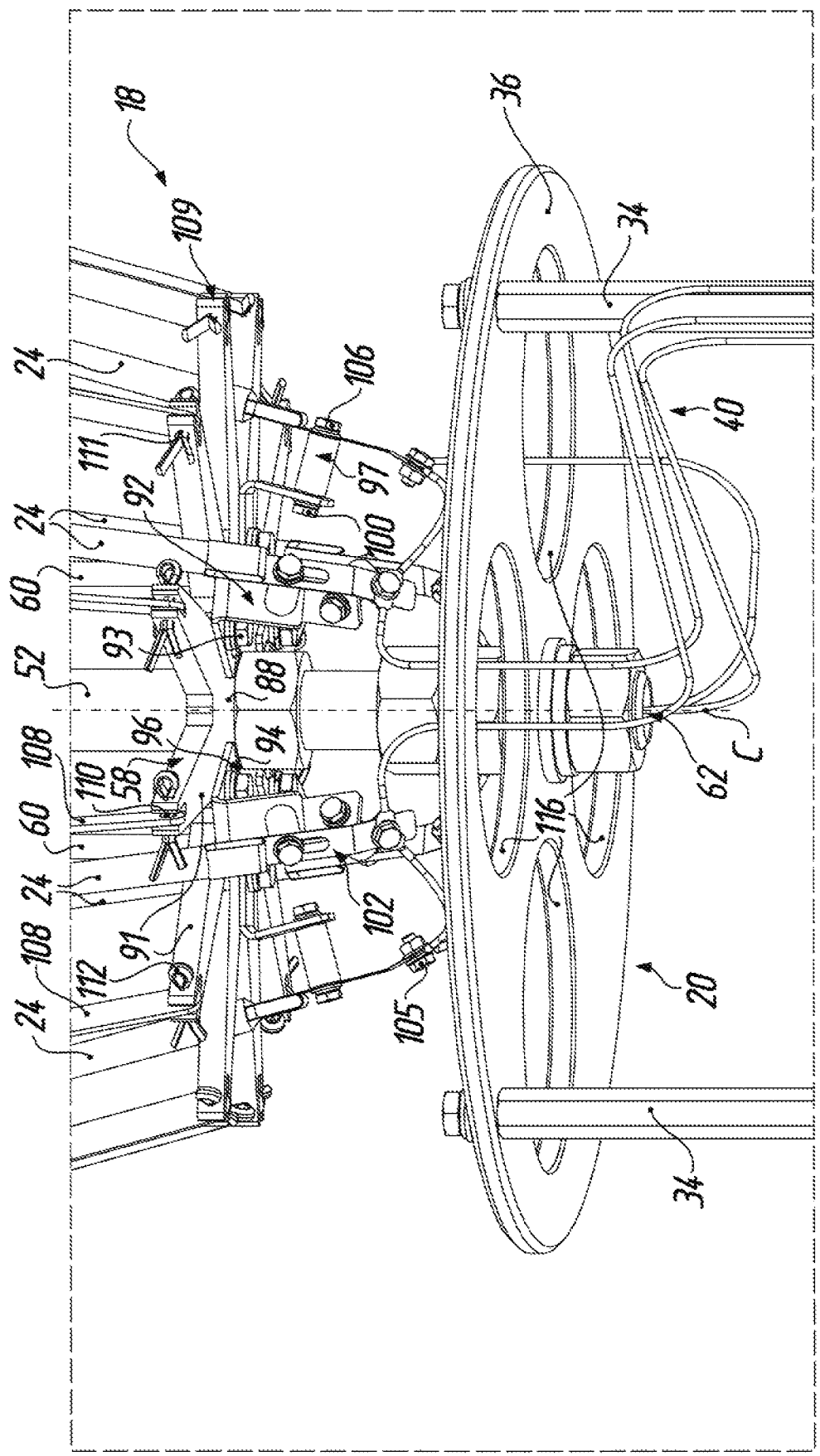
FIG. 9 shows a perspective view, to a further enlarged scale, of the removable heating device according to FIG. 1 in correspondence with the detail IX in FIG. 6.

As can further be taken from FIGS. 6 and 8 in particular, the U-shaped handles 38 are mounted to the inner base section 87 of the middle hub portion 56 from below with the aid of a screw connection 114 at the free end of each leg of the respective handle 38. Finally, the middle hub portion 56 as well as the base plate 36 are provided with passage openings 115, 116, namely three passage openings 115 in the middle hub portion 56 and four passage openings 116 in the base plate 36, which are uniformly distributed about the central axis C in the respective part.

The passage openings 115, 116 not only reduce the weight of the stand 20 but especially also provide a good transmissibility for gases and vapor as well as heat radiation in use of the heating device 18. In fact, the heating device 18 as a whole with its rod-shaped elements (electric heating elements 22, 24, leg portions 34, central post 52, frame bars 60, protection bars 108) and recessed hub portions 54, 56, 58 and base plate 36 (star-shape and passage openings 115, 116) offers very little resistance to gas and vapor movement during the pumping down of the vacuum chamber 12 and also provides for very uniform, substantially unobstructed heat radiation in all radial directions with respect to the central axis C.

With respect to the actual vacuum leak test procedure using the above-described heating device 18, it remains to be noted that this testing method differs from the known pressure rise test discussed in the introductory part of the description only by the following additional steps. At the beginning of the vacuum check routine: 1. put the removable heating device 18 inside of the vacuum chamber 12; 2. position it in the center of the vacuum chamber 12 accordingly to a specific place, e.g., directly above the evaporation source 14; 3. connect the fast-electric-plug 46 of the heating device 18 to the chamber-sided fast-electric-socket 48 to provide energy supply to the heating device 18; 4. close the door of the vacuum chamber 12 and start the pumping system. At the end of the vacuum check routine: 1. after venting the vacuum chamber 12 and opening of the door, disconnect the fast-electric-plug 46 from the fast-electric-socket 48 in the vacuum chamber 12; 2. remove the heating device 18 from the box coating apparatus 10; 3. move the heating device 18 to its storage place or to another box coating apparatus for carrying out vacuum check and cleaning routines. The same additional steps need to be performed as part of any cleaning routines.

A box coating apparatus for vacuum coating of substrates comprises a vacuum chamber which contains an evaporation source for evaporating coating material and a substrate holder disposed vis-à-vis to the evaporation source so that coating material evaporated by the evaporation source can impinge on substrates held by the substrate holder. An electric heating device is centrally arranged in the vacuum chamber, which is adapted to heat up the vacuum chamber in case of vacuum check and cleaning routines. So as to be also adapted to be removable from the vacuum chamber prior to the deposition processes, the heating device is provided with a stand having a plurality of leg portions mounted to a base plate, which are sized and arranged at the base plate so that the heating device can be placed over and above the evaporation source.

Variations and modification are possible without departing from the scope and spirit of the present invention as defined by the appended claims.

We claim:

1. A box coating apparatus for vacuum coating of substrates comprising a vacuum chamber which contains an evaporation source for evaporating coating material and a substrate holder for holding a plurality of substrates, that is disposed relative to said evaporation source so that coating material evaporated by said evaporation source can impinge on substrates held by said substrate holder, wherein an electric heating device with at least one heating element is arranged in said vacuum chamber, which is constructed to heat up said vacuum chamber in case of vacuum check and cleaning routines, characterized in that said heating device is provided with a stand to be constructed to be removable from said vacuum chamber without moving or disturbing said evaporations source, wherein said stand has a plurality of leg portions mounted to a base plate of said stand, which are sized and arranged at said base plate so that said heating device can be positioned such that its at least one heating element is entirely over and above said evaporation source when installed in said vacuum chamber without moving or disturbing said evaporation source.

2. The box coating apparatus according to claim 1, characterized in that said heating device with its stand is constructed to be removably arranged at a central region of said vacuum chamber adjacent to said evaporation source.

3. The box coating apparatus according to claim 2, characterized in that said heating device comprises an electrical connection for supplying energy to said heating device, wherein said electrical connection is constructed to be connected to a mating electrical connection within said vacuum chamber.

4. The box coating apparatus, for vacuum coating of substrates comprising a vacuum chamber which contains an evaporation source for evaporating coating material and a substrate holder for holding a plurality of substrates, that is disposed relative to said evaporation source so that coating material evaporated by said evaporation source can impinge on substrates held by said substrate holder, wherein an electric heating device is arranged in said vacuum chamber, which is constructed to heat up said vacuum chamber in case of vacuum check and cleaning routines, characterized in that said heating device is provided with a stand to be constructed to be removable from said vacuum chamber wherein said stand has a plurality of leg portions mounted to a base plate of said stand, which are sized and arranged at said base plate so that said heating device can be placed over and above said evaporation source, said heating device with its stand is constructed to be removably arranged at a central region of said vacuum chamber adjacent to said evaporation source, said heating device comprises an electrical connection for supplying energy to said heating device, wherein said electrical connection is constructed to be connected to a mating electrical connection within said vacuum chamber and said electrical connection of said heating device comprises a fast-electric-plug, whereas said mating electrical connection within said vacuum chamber has a fast-electric-socket electrically contacted via an air-vacuum electric feed-through, or vice versa.

5. The box coating apparatus according to claim 4, characterized in that said stand has a central axis, wherein at least one electric heating element is constructed about said central axis so as to uniformly emit thermal radiation in essentially radial directions with respect to said central axis.

6. The box coating apparatus according to claim 5, characterized in that said central axis extends in a substantially vertical direction in an operational state of the heating device, which has a plurality of electric heating elements uniformly distributed with respect to said central axis of said stand over a circumference of said stand.

7. The box coating apparatus according to claim 6, characterized in that part of said electric heating elements are constructed at an acute angle with respect to said central axis so as to face upwards away from the central axis, while another part of said electric heating elements are constructed at an acute angle with respect to said central axis so as to face downwards away from the central axis.

8. The box coating apparatus according to claim 7, characterized in that said at least one electric heating element is rod-shaped.

9. The box coating apparatus according to claim 8, characterized in that said stand has an upper hub portion and a lower hub portion which are rigidly connected with each other by at least one frame bar, wherein said at least one electric heating element is supported between said upper hub portion and said lower hub portion.

10. The box coating apparatus according to claim 9, characterized in that said at least one electric heating element are arranged in pairs of electric heating elements connected in series, wherein said pairs of electric heating elements are attached to said upper hub portion and said lower hub portion on a respective common circumference thereof, and wherein a middle hub portion is provided, which is rigidly connected with said upper hub portion and said lower hub portion via said at least one frame bar, and supports said electric heating elements of each pair of electric heating elements adjacent to a connecting point thereof.

11. The box coating apparatus according to claim 10, characterized in that said hub portions and/or said base plate are provided with passage openings.

12. The box coating apparatus according to claim 11, characterized in that said hub portions are substantially star-shaped as seen in a plan view, with an inner base section and outer arm sections extending therefrom, wherein said electric heating elements are attached to said respective hub portions inbetween adjacent arm sections.

13. The box coating apparatus according to claim 12, characterized in that two protection bars are assigned to each electric heating element, which are arranged at positions where they protect said respective electric heating element against mechanical impact, and essentially without obstructing the thermal radiation radially emitted from said respective electric heating element.

14. The box coating apparatus according to claim 13, characterized in that said protection bars are attached to free ends of said outer arm sections of said hub portions.

15. The box coating apparatus according to claim 14, characterized by a central post that is constructed to extend through said hub portions, wherein said central post is tubular in shape in order to accommodate electrical wiring for said electric heating elements.

16. The box coating apparatus according to claim 15, characterized in that said stand is provided with at least one handle that allows to move and position the heating device.

17. The box coating apparatus according to claim 16, characterized in that said at least one electric heating element is an electric infrared quartz lamp.

18. The box coating apparatus according to claim 1, characterized in that said heating device comprises an electrical connection for supplying energy to said heating device, wherein said electrical connection is constructed to be connected to a mating electrical connection within said vacuum chamber.

19. The box coating apparatus for vacuum coating of substrates comprising a vacuum chamber which contains an evaporation source for evaporating coating material and a substrate holder for holding a plurality of substrates, that is disposed relative to said evaporation source so that coating material evaporated by said evaporation source can impinge on substrates held by said substrate holder, wherein an electric heating device is arranged in said vacuum chamber, which is constructed to heat up said vacuum chamber in case of vacuum check and cleaning routines, characterized in that said heating device is provided with a stand to be constructed to be removable from said vacuum chamber wherein said stand has a plurality of leg portions mounted to a base plate of said stand, which are sized and arranged at said base plate so that said heating device can be placed over and above said evaporation source, said heating device comprises an electrical connection for supplying energy to said heating device, wherein said electrical connection is constructed to be connected to a mating electrical connection within said vacuum chamber, said electrical connection of said heating device comprises a fast-electric-plug, whereas said mating electrical connection within said vacuum chamber has a fast-electric-socket electrically contacted via an air-vacuum electric feed-through, or vice versa.

20. The box coating apparatus according to claim 1, characterized in that said stand has a central axis, wherein at least one electric heating element is constructed about said central axis so as to uniformly emit thermal radiation in essentially radial directions with respect to said central axis.

21. The box coating apparatus according to claim 20, characterized in that said central axis extends in a substantially vertical direction in an operational state of the heating device, which has said at least one electrical element being a plurality of electric heating elements uniformly distributed with respect to said central axis of said stand over a circumference of said stand.

22. The box coating apparatus for vacuum coating of substrates comprising a vacuum chamber which contains an evaporation source for evaporating coating material and a substrate holder for holding a plurality of substrates, that is disposed relative to said evaporation source so that coating material evaporated by said evaporation source can impinge on substrates held by said substrate holder, wherein an electric heating device is arranged in said vacuum chamber, which is constructed to heat up said vacuum chamber in case of vacuum check and cleaning routines, characterized in that said heating device is provided with a stand to be constructed to be removable from said vacuum chamber wherein said stand has a plurality of leg portions mounted to a base plate of said stand, which are sized and arranged at said base plate so that said heating device can be placed over and above said evaporation source, said stand has a central axis, wherein at least one electric heating element is constructed about said central axis so as to uniformly emit thermal radiation in essentially radial directions with respect to said central axis, said central axis extends in a substantially vertical direction in an operational state of the heating device, which has said at least one electrical element being a plurality of electric heating elements uniformly distributed with respect to said central axis of said stand over a circumference of said stand part of said electric heating elements are constructed at an acute angle with respect to said central axis so as to face upwards away from the central axis, while another part of said electric heating elements are constructed at an acute angle with respect to said central axis so as to face downwards away from the central axis.

23. The box coating apparatus according to claim 20, characterized in that said at least one electric heating element is rod-shaped.

24. The box coating apparatus for vacuum coating of substrates comprising a vacuum chamber which contains an evaporation source for evaporating coating material and a substrate holder for holding a plurality of substrates, that is disposed relative to said evaporation source so that coating material evaporated by said evaporation source can impinge on substrates held by said substrate holder, wherein an electric heating device is arranged in said vacuum chamber, which is constructed to heat up said vacuum chamber in case of vacuum check and cleaning routines, characterized in that said heating device is provided with a stand to be constructed to be removable from said vacuum chamber wherein said stand has a plurality of leg portions mounted to a base plate of said stand, which are sized and arranged at said base plate so that said heating device can be placed over and above said evaporation source, said stand has a central axis, wherein at least one electric heating element is constructed about said central axis so as to uniformly emit thermal radiation in essentially radial directions with respect to said central axis, said stand has an upper hub portion and a lower hub portion which are rigidly connected with each other by at least one frame bar, wherein said at least one electric heating element is supported between said upper hub portion and said lower hub portion.

25. The box coating apparatus according to claim 24, characterized in that said electric heating elements are arranged in pairs of electric heating elements connected in series, wherein said pairs of electric heating elements are attached to an upper hub portion and a lower hub portion on a respective common circumference thereof, and wherein a middle hub portion is provided, which is rigidly connected with said upper hub portion and said lower hub portion via at least one frame bar, and supports said electric heating elements of each pair of electric heating elements adjacent to a connecting point thereof.

26. The box coating apparatus according to claim 25, characterized in that said hub portions and/or said base plate are provided with passage openings.

27. The box coating apparatus according to claim 26, characterized in that said hub portions are substantially star-shaped as seen in a plan view, with an inner base section and outer arm sections extending therefrom, wherein said electric heating elements are attached to said respective hub portions inbetween adjacent arm sections.

28. The box coating apparatus according to claim 27, characterized in that two protection bars are assigned to each electric heating element, which are arranged at positions where they protect said respective electric heating element against mechanical impact, and essentially without obstructing the thermal radiation radially emitted from said respective electric heating element.

29. The box coating apparatus according to claim 28, characterized in that said protection bars are attached to free ends of said outer arm sections of said hub portions.

30. The box coating apparatus according to claim 24, characterized by a central post that is constructed to extend through said hub portions, wherein said central post is tubular in shape in order to accommodate electrical wiring for said at least one electric heating element.

31. The box coating apparatus according to claim 20, characterized in that said stand is provided with at least one handle that allows to move and position the heating device.

32. The box coating apparatus according to claim 20, characterized in that said at least one electric heating element is an electric infrared quartz lamp.

\* \* \* \* \*